United States Patent [19]

Green et al.

[11] Patent Number: 5,080,725
[45] Date of Patent: Jan. 14, 1992

[54] OPTICAL PROPERTIES OF SOLAR CELLS USING TILTED GEOMETRICAL FEATURES

[75] Inventors: Martin A. Green, Waverley; Stuart R. Wenham, Illawong, both of Australia

[73] Assignee: Unisearch Limited, Kensington, Australia

[21] Appl. No.: 477,945

[22] PCT Filed: Dec. 16, 1988

[86] PCT No.: PCT/AU88/00482
  § 371 Date: Jun. 15, 1990
  § 102(e) Date: Jun. 15, 1990

[87] PCT Pub. No.: WO89/06051
  PCT Pub. Date: Jun. 29, 1989

[30] Foreign Application Priority Data

Dec. 17, 1987 [AU] Australia .................. PI5965
Aug. 19, 1988 [AU] Australia .................. PI9993

[51] Int. Cl.⁵ .................. H01L 31/06; H01L 31/18
[52] U.S. Cl. .................. 136/256; 156/647; 156/662; 357/30; 437/2; 136/259
[58] Field of Search .......... 136/256, 259; 357/30 J, 357/30 L; 437/2-5; 156/647, 662

[56] References Cited

U.S. PATENT DOCUMENTS 4,137,123  1/1979  Bailey et al. .................. 156/647
4,360,701  11/1982  Evans, Jr. .................. 136/259
4,379,944  4/1983  Borden et al. .................. 136/259

FOREIGN PATENT DOCUMENTS

B-36664/84  9/1987  Australia .
2917743  11/1979  Fed. Rep. of Germany .
2066565  7/1981  United Kingdom .
2186074  8/1987  United Kingdom .

OTHER PUBLICATIONS

N. M. Bordina et al., *Geliotekhnika*, vol. 18, No. 3, pp. 6-11 (1982).

Primary Examiner—Aaron Weisstuch
Attorney, Agent, or Firm—Armstrong, Nikaido, Marmelstein, Kubovcik & Murray

[57] ABSTRACT

Solar cells are produced in which surface texturing of the substrate surface, in the form of geometric ridges and pyramids, are formed at an angle to the perpendicular such that the ridges and pyramids are not symmetrical about a perpendicular axis or plane. Such "tilted" texturing causes an increased number of passes of trapped light within the cell and also within the encapsulation covering the cell thereby increasing the chances of light being absorbed. A process for manufacture of cells with tilted texturing involves sawing a wafer from an ingot at an angle α to the 100 plane and then processing the wafer in a conventional fashion, including texturing the surface with ridges or pyramids.

11 Claims, 8 Drawing Sheets

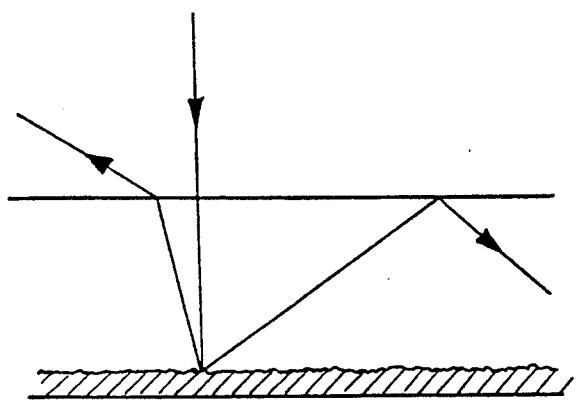
FIG.1
PRIOR ART
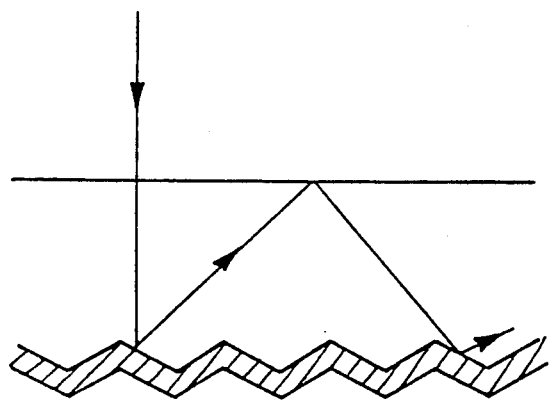
FIG.2
PRIOR ART
FIG.3
PRIOR ART
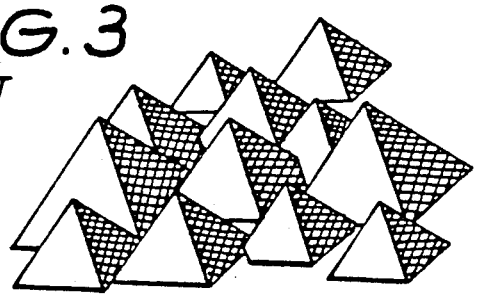
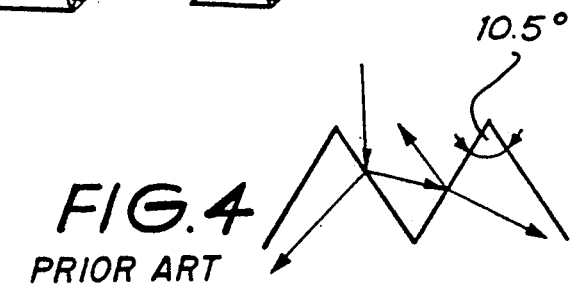
FIG.4
PRIOR ART

OPTICAL PROPERTIES OF SOLAR CELLS USING TILTED GEOMETRICAL FEATURES

The present invention relates to improvements in the fabrication of solar cells whereby the structure of the top surface of the cell facilitates the trapping within the cell of light that is weakly absorbed by the cell material.

Ideally, solar cells should be designed to maximise the area of the cell intercepting the sun's rays while minimizing the volume of cell material; that is, the cells should be as thin as practical Not only does this minimize the cost of cell material, it also can give a performance advantage by minimising the loss of light generated carriers by recombination in the cell volume.

However, if the cell is made too thin, an increasingly large portion of the light will pass through the cell without being absorbed and be wasted. Due to these conflicting constraints, there will be an optimum thickness for highest energy conversion efficiency for each cell material. For crystalline silicon solar cells, this optimum thickness is about 100 microns, reducing to thinner values if the cell is used with focussed (concentrated) sunlight. This assumes that the cell incorporates a technique for trapping weakly absorbed light into the cell for as long as possible.

A common method for controlling reflection in crystalline solar cells is to form geometrical features on the cell surface by anisotropic etching to expose intersecting (111) crystallographic planes. Pyramids or grooves formed in this way reduce reflection by giving light two chances of being coupled into the cell. If the fraction of light reflected at the first point of incidence is R, the overall fraction of light reflected with this "double bounce" approach will be approximately $R^2$, a much smaller number.

The light trapping properties of such pyramids and grooves have been investigated both theoretically and experimentally. Theoretically, it has been with these features as normally implemented, the best light trapping performance is obtained with geometrical features on both top and rear cell surfaces leg, see FIG. 5). Experimentally, this can be inconvenient as in the case of rear-contacted cells, or it can give poorer results than expected due to decreased effective rear reflectance because of the multiple "bounces" of light on the rear surface.

A simply implemented improvement is described based on "tilting" the previous geometrical features. This gives excellent light trapping properties while allowing planar rear surfaces to be retained. Perhaps of more general importance is the fact that it can also be used to significantly reduce reflection loss from the cell/encapsulant interface, without the need for antireflection coatings.

According to a first aspect, the present invention consists in a solar cell comprising a substrate having a top, or light receiving, surface in which is formed a geometric structure of ridges or pyramids and a bottom surface which is substantially flat, the geometric structure being tilted relative to the bottom surface of the substrate.

According to a second aspect the present invention consists in a method of manufacturing a solar cell comprising the steps of:
(a) sawing a crystalline wafer of substrate material at an angle $\alpha$ to its (100) plane; and
(b) using a selective etch to etch grooves in the top surface of the substrate thereby producing a geometric structure of ridges or pyramids in said top surface, the geometric structure being tilted relative to a bottom surface of the substrate by said angle $\alpha$ as a result of the selective etch.

In preferred embodiments of the present invention tilt angles in the range of 2°-33° will typically be used, with angles of about 7°-8° being preferred for unencapsulated cells and angles of 15°-24° being preferred for encapsulated cells.

In embodiments in which a ridged top surface is employed on a crystalline substrate the structure will preferably be tilted towards a (111) plane with a component of tilt towards the (110) plane, while in embodiments employing a pyramid structure on a crystalline substrate the structure will preferably be tilted symmetrically towards the (110) plane. In either case, a second tilt towards another plane might also optionally be employed.

Embodiments of the invention will now be discussed in greater detail with reference to the accompanying drawings, in which:

FIG. 1 schematically illustrates a prior art solar cell having a randomly patterned rear surface;

FIG. 2. schematically illustrates a solar cell having a rear surface provided with a geometric structure;

FIG. 3 illustrates a surface structure comprising square based pyramids;

FIG. 4 illustrates the mechanism for reduction of reflection in upright slats and pyramids;

Figure 6:
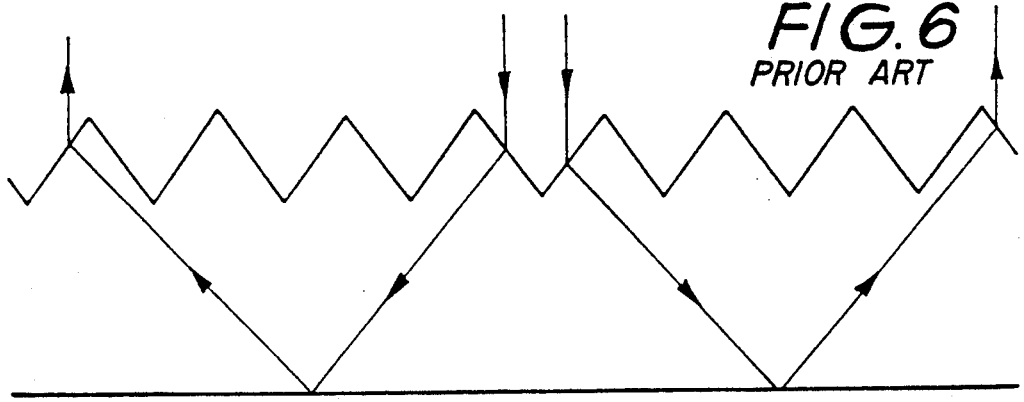
Figure 7:
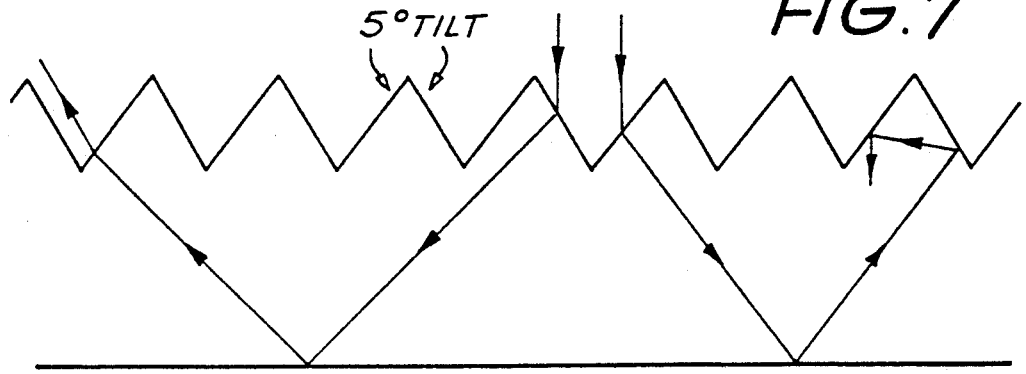
Figure 8:
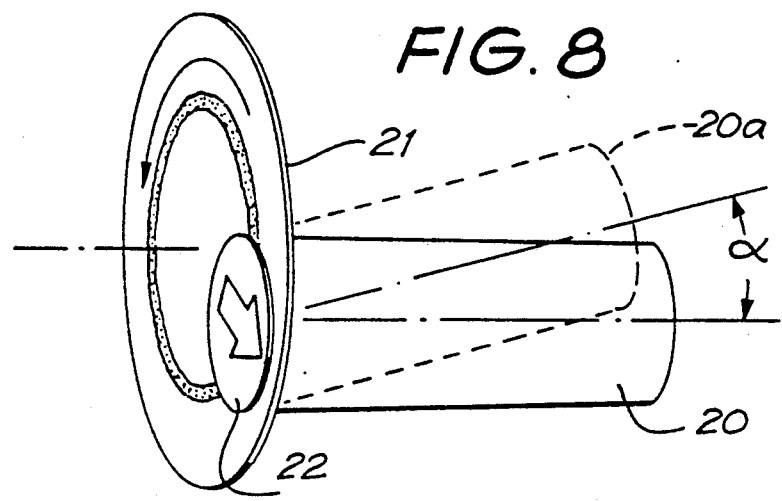
Figure 9A:
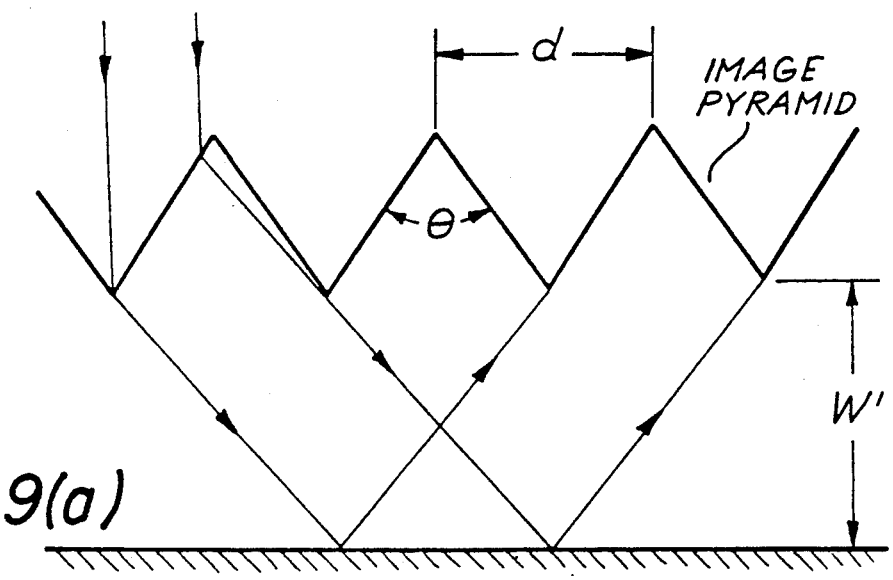
Figure 9B:
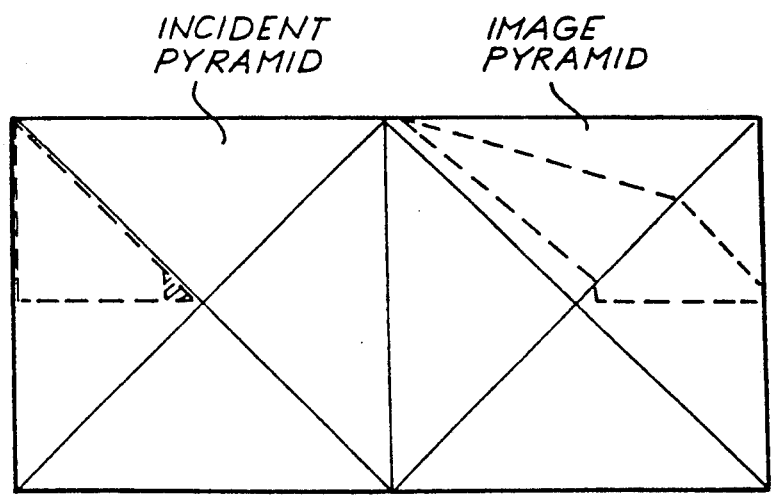
Figure 10:
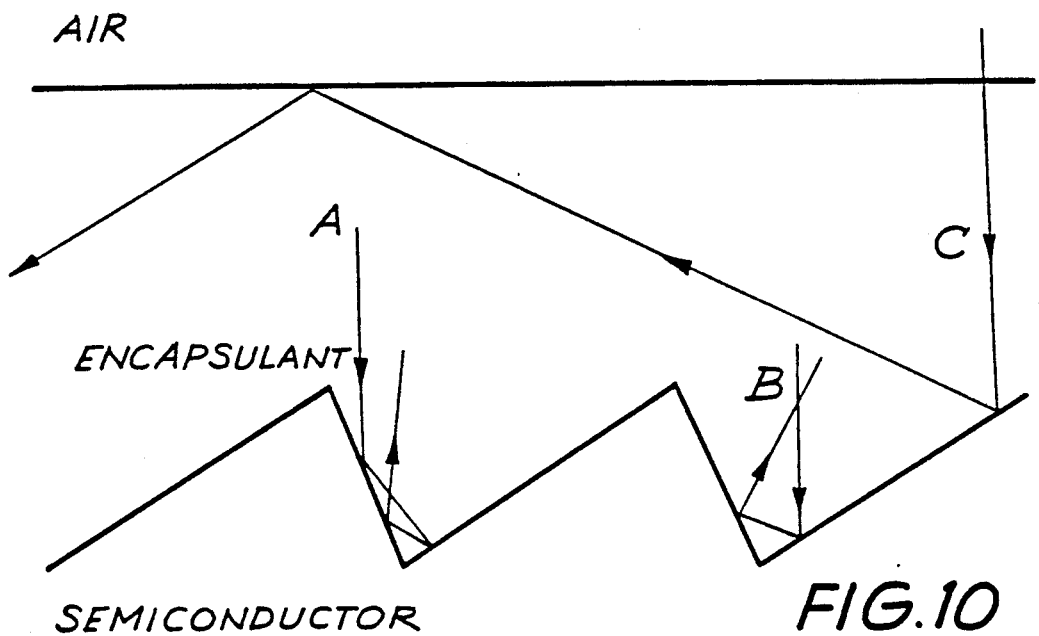
Figure 11:
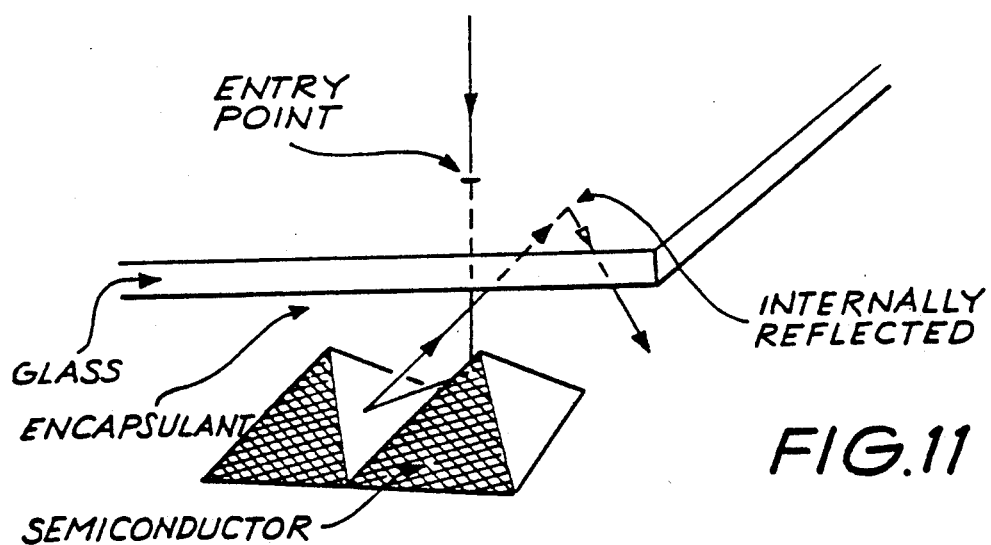
Figure 12:
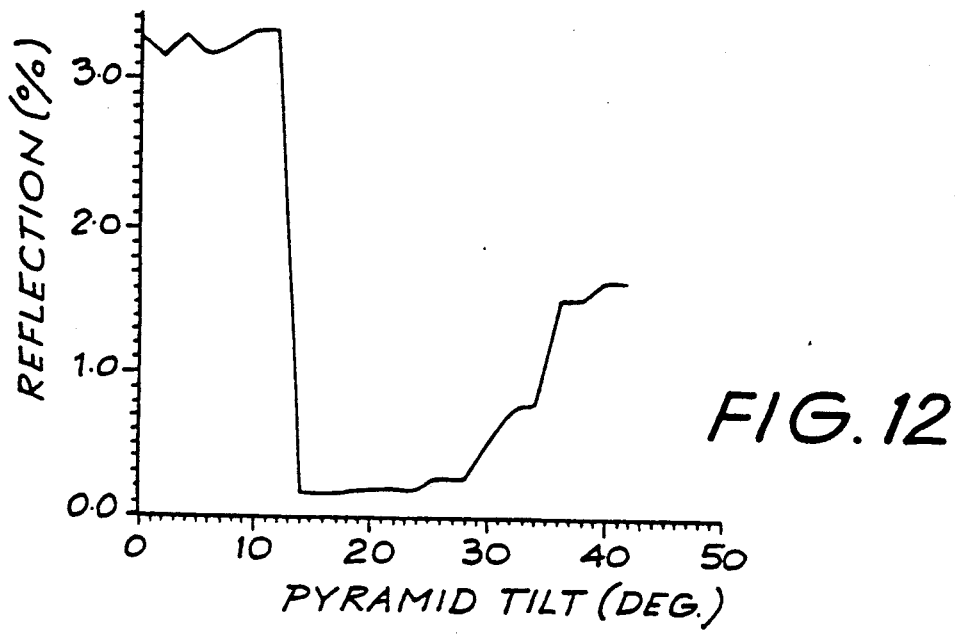
Figure 13:
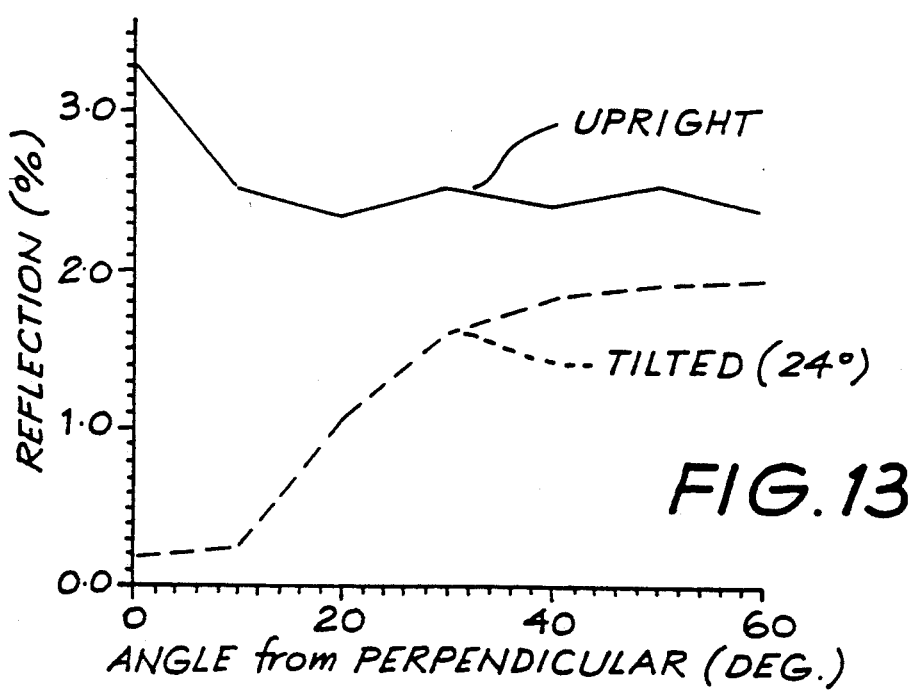
Figure 14:
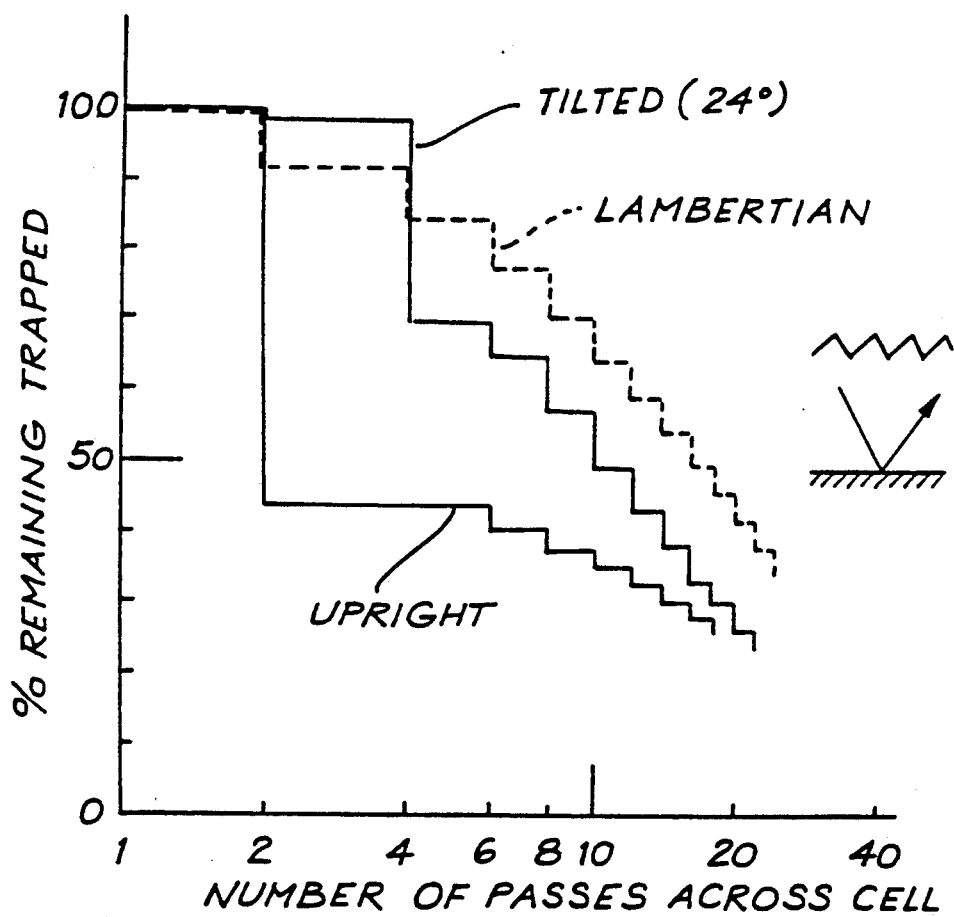
Figure 15:
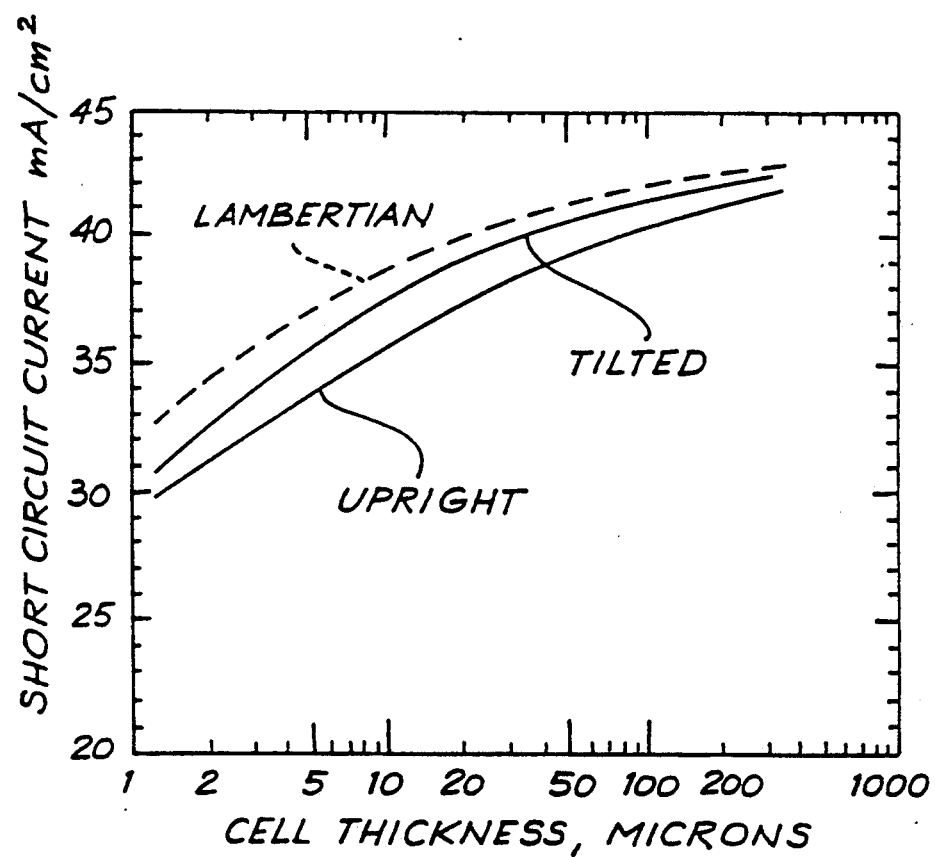
Figure 16:
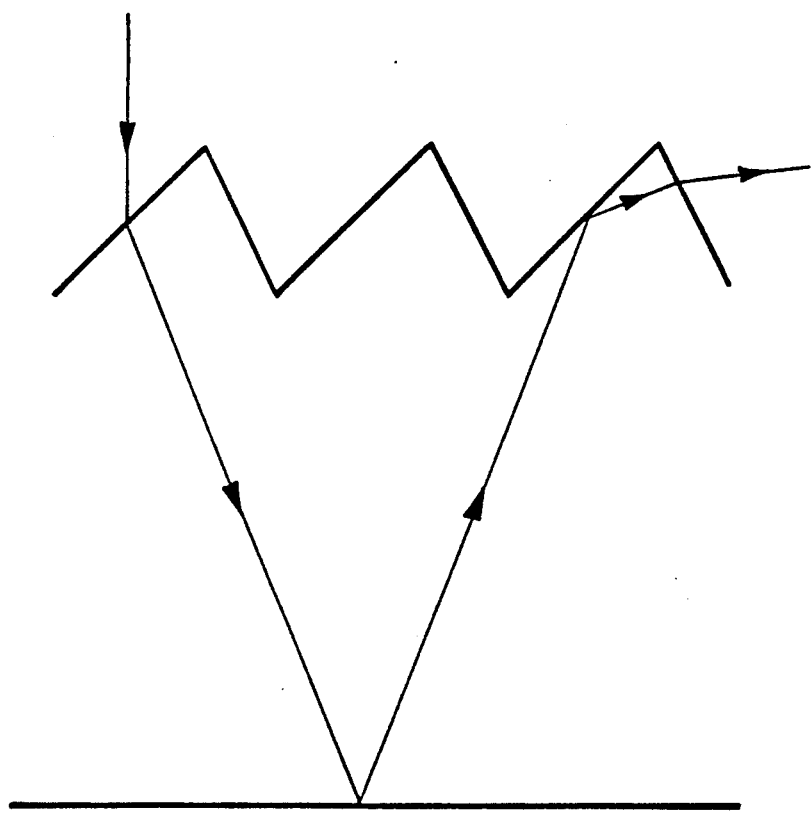

FIG. 6 schematically illustrates the path of light through a solar cell having a top surface provided with symmetrical grooves when the angle of incidence of the illuminating light is perpendicular to the plane of the solar cell;

FIG. 7 schematically illustrates the path of light through a solar cell having a top surface provided with grooves tilted at an angle of 5° relative to the back surface of the cell with illumination similar to that of FIG. 6;

FIG. 8 schematically illustrates one method of tilting the wafer at the sawing stage;

FIGS. 9A and 9B schematically illustrate the path of light through a solar cell having a surface structure of symmetrical pyramids with illumination similar to that of FIG. 6;

FIG. 10 schematically illustrates three reflection modes within the encapsulation over a substrate surface having tilted ridges or pyramids;

FIG. 11 schematically illustrates a reflection mode within the encapsulation over a substrate surface having pyramids tilted towards one base corner;

FIG. 12 graphically illustrates total reflection of perpendicularly incident light from the surface of an encapsulated cell as a function of the tilt angle of randomly distributed pyramids (R=0.2);

FIG. 13 graphically illustrates angular sensitivity of reflection loss at the cell encapsulant interface as a function of the angle of incidence of light away from the normal for both upright and tilted pyramids;

FIG. 14 graphically illustrates the percentage of light remaining trapped in a cell as a function of the number of passes across the cell for three light trapping schemes: "Lambertian", upright pyramids and tilted pyramids;

FIG. 15 graphically illustrates the limit on the current output of silicon cells as a function of cell thickness for three different light trapping schemes (Global AM1.5 spectrum, 97 mW/cm$^2$); and FIG. 16 schematically illustrates additional modes of internal reflection in a tilted geometric structure.

Referring to FIGS. 1 and 2, two types of schemes have been proposed for effecting light trapping in solar cells. The first, shown in FIG. 1, relies on randomizing the direction of light within the cell. A large fraction of such randomized light is trapped into the cell by total internal reflection. A second class of scheme shown in FIG. 2 is based on using geometrical structures on one or both cell surfaces. These act to control the direction of light within the cell and so keep it trapped.

These geometrical schemes are well suited to crystalline solar cells since it is possible to simply form some particular geometrical features in such cells. One such feature widely used in commercial cells to reduce reflection from the top cell surface is the network of square based pyramids shown in FIG. 3. These pyramids are formed by anisotropic etching of wafers originally of (100) crystallographic orientation.

By etching the substrate with an etch that etches relatively slowly in the (111) crystallographic direction, square based pyramids can be formed on the wafer surface by etching until (111) crystallographic planes are exposed as shown in FIG. 3. The advantage of this is that light striking the cell from above is mostly coupled into the cell at the point where it strikes the cell surface. That which is reflected is reflected downwards so that it has a second chance of being coupled into the cell as shown in FIG. 4. If the fraction of light reflected at the first point of impact is R, the overall fraction reflected will be approximately $R^2$ with this approach. Since R is generally less than 0.2, $R^2$ becomes less than 0.04 showing the effectiveness of this approach With suitable masking prior to etching or other techniques it is also possible to form slats as in FIG. 3 on one or more cell surfaces, with the slats formed by intersecting (111) crystallographic planes.

Figure 5:
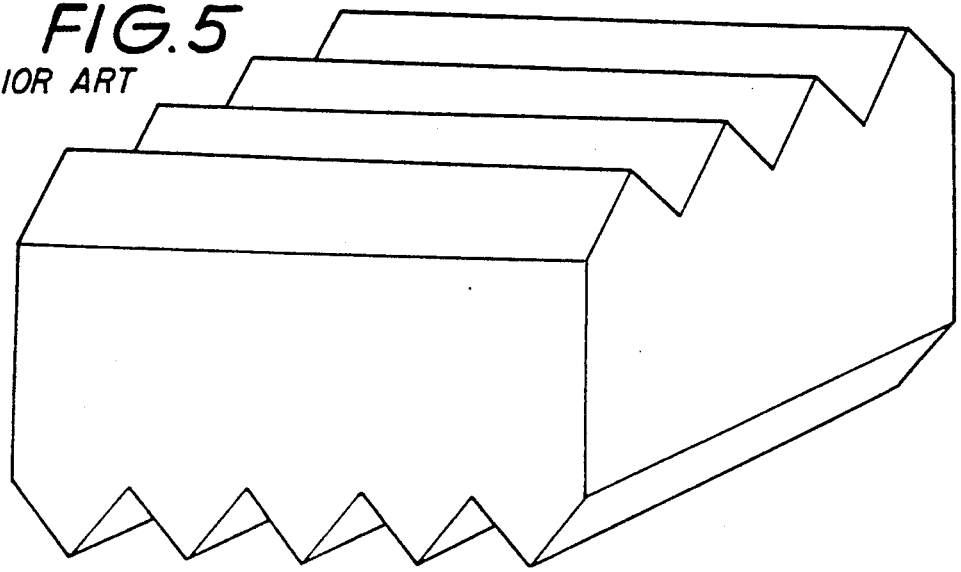
FIG. 5 illustrates a substrate having grooved front and rear surfaces, the grooves in the respective surfaces running in mutually perpendicular directions.

A similar technique can be used to form grooves as shown in FIG. 5 on the top or rear surface. Again the sides of the grooves are formed by intersecting (111) crystallographic planes.

Another advantage of forming such structures on the top surface of the cell is shown in FIG. 6. The light refracted into the cell follows an oblique path across the cell Since the probability of absorption of the light increases as with the length of its path within the cell, this means that the light will be absorbed closer to the top surface of the cell. Weakly absorbed light will follow the path in FIG. 6 whereby at least some will be reflected from the rear of the cell and have a second oblique pass across the cell. Some will then be refracted out the top surface of the cell as in FIG. 6. This double oblique pass across the cell increases the amount of weakly absorbed light which is absorbed in the cell.

For the case shown in FIG. 6, if the top surface structure is formed by slats, all the light reflected from the rear will strike a face or orientation opposite from that of the face which coupled it in. All light in this case will consequently be coupled out of the cell after a single pass across the cell and back.

If the top surface structure is formed by the square based pyramids of FIG. 3, only some of the light will follow the route of FIG. 6 The remainder will strike one of the two faces oblique to the plane of the paper and its perpendicular plane. Such light is retained within the cell by total internal reflection from this face and can make further double passes across the cell. Analysis shows that instead of 100% being coupled out after only one double pass as in the case of the slats, only about 55% as in the case of pyramids. The pyramids are therefore more effective in trapping weakly absorbed light within the cell.

A comprehensive analysis of the light trapping properties of cells incorporating such pyramids and grooves has recently been reported by Campbell and Green (*Journal of Applied Physics*, Vol. 62, p. 243, 1987). One conclusion reached was that the combination of pyramids or grooves on the top surface of the cell in combination with a flat reflective rear surface did not give good light trapping properties. However, if structure was incorporated on both surfaces as in FIG. 5, improved light trapping was obtained. In fact, the structure of FIG. 5, as also described by Landis (U.S. Pat. No. 4,608,415), gave the best light trapping of all schemes examined by Campbell and Green.

This appeared to be an unfortunate conclusion since some cell structures require a flat rear surface. A notable example is the point-contact solar cell described by Swanson and co-workers (*IEEE Electron Device Letters*, Vol. EDL 7, p. 567, 1986). This cell uses pyramids on the top cell surface to reduce reflection and to promote light-trapping within the cell. However, a flat back surface is very desirable for this structure to allow the fine linewidth photolithographic processing necessary to define the "point" contact areas and to define the positive and negative metallization patterns, both of which lie on the rear surface of the cell. Similar considerations would apply to other "rear contacted" solar cells. Even for more conventional solar cells, a flat rear surface is desirable to maximise reflection from the rear surface and to simplify processing.

Despite the fact that the cells developed by Swanson and co-workers have demonstrated energy conversion efficiencies of 28% under concentrated sunlight, the calculations of Campbell and Green show that at least 4% (relative) performance is being lost due to the less than ideal properties of the light trapping scheme incorporated.

Embodiments Of the present invention provide a simply implemented modification to the structure of cells which gives excellent light trapping properties while allowing a flat rear surface. These embodiments of the invention make use of the same pyramids and grooves as previously described but with the alignment of these geometrical features tilted with respect to the flat rear surface of the wafer. It is subsequently shown that this greatly improves the light trapping capability of this flat rear case. In fact, modelling results show that the approach is better than the best case previously analysed (that of FIG. 5), even though the latter involves structure on both sides of the cell.

The required tilting of the pyramids can be obtained surprisingly simply. Normally crystalline wafers are sawn with their faces parallel to a low index crystallographic plane; generally the (100) plane for silicon devices. As illustrated in FIG. 8, a deliberate tilting of the ingot 20, 20a to be sawn by more than a few degrees relative to the normal to the saw blade 21 in any direction away from the (100) plane will allow at least some of the light trapping benefits to be obtained in the cells produced from the resulting wafer 22. For pyramids, a symmetrical tilting a small way towards a (110) plane is believed to be optimal, although less symmetrical tilting appears to be better for grooves. The manufacturing cost for such "off-axis" wafers is essentially the same as the normal product. Other seemingly less attractive options would be to alter the surface orientation of the wafer during mechanical or chemical thinning steps.

Starting with "off axis" wafers, the pyramids or grooves can be formed by the same techniques as normally used. Pyramids can be formed either by random nucleation of selective etches or by defining pYramid peaks by techniques such as using silicon oxide pads defined by photolithography. A commonly used selective etch is hot (90° C.), dilute (2% weight/volume) NaOH solution. In the case of grooves, oxide strips defined by photolithography can be used to locate the groove tops. Alternatively, laser grooving can be used to nucleate the selective etches as described by Wenham and Green (U.S. Pat. No. 4,626,613).

The easiest case to understand how the advantage of "off axis" wafering arises is that of grooves. FIG. 6 shows the path of rays for the normal "on axis" case. The grooves are very ineffective in light trapping Light incident on either face of the grooves is coupled out the opposite face after one reflection from the rear surface. With only a slight tilt, anything greater than about 2°, the situation changes. FIG. 7 shows the case of a 5° tilt towards one of the (111) planes forming the groove faces. Light incident on the face of the groove with the steeper face is coupled out as before. However, light incident on the less steeply sloping face is reflected so that it strikes the opposite face at an angle greater than 16.6°, which is the critical angle for total internal reflection. This light is trapped into the cell for additional passes across the cell thickness.

Numerical computation shows that about 60% of the light entering the cell is trapped into the cell for more than the first double pass for tilt angles towards one of the groove faces between 2° and 7°. As the tilt angle increases above this, the situation becomes even better, since an increasing fraction of the escaping rays of FIG. 7 will hit the steeply sloping face opposite that from which they escaped. These rays will be coupled back into the cell and make additional passes across it. With increasing tilt angles, other mechanisms as in FIG. 16 start coming into play. At tilt angles greater than about 20°, all the light is calculated to stay trapped for at least two double passes across the cell. The case of tilted pyramids remains superior to that of tilted slats for tilt angles lower than the value at which this condition is reached.

An additional angle of tilt in the direction into the page can be added by preparing the wafer off axis more towards (110) planes than (111). At each rear reflection, the reflected ray will receive an angular component in the direction perpendicular to the page. These components will quickly add up to exceed the angle for total internal reflection and inhibit the escape of light. If the tilt in this direction is greater than about 7°, a sufficiently large angular component will be collected on the first rear reflection to inhibit the escape mechanism of FIG. 7.

Reflection from the rear may be obtained by relying upon total internal reflection or by using a highly reflective metal along the rear, or a dielectric/metal combination or a purely dielectric reflector. This improved trapping of light will improve the current output and hence the energy conversion efficiency of the cell.

The case of tilted pyramids is expected to be even better. FIG. 9 shows the situation of a regular layout of pyramids without tilt. It is similar to the case of the grooves of FIG. 6 except there are three faces which light from the gear can strike after the first rear reflection. Only light striking one of these faces is coupled out, giving improved light trapping compared to non-tilted grooves. However, with a random layout of pyramids, about 60% of light will still be coupled out after the first double pass.

Tilting the pyramids will improve the situation for the same reason as in the case of the grooves. Light incident on the more gently sloping faces will be trapped more effectively than when the pyramids are upright, while that incident on the more steeplY sloping faces will be no worse off than originally. The optimum tilt direction is expected to be a symmetrical tilt towards a (110) plane. The advantages outlined for the bi-directional tilt in the case of the grooves would also apply to this case.

The advantage discussed above becomes most pronounced when tilted features are used on the top surface in conjunction with a flat, planar rear surface.

This is an ideal situation for obtaining a high reflectivity from the rear since only "single bounce" reflections occur from such a surface. It is also an ideal situation for rear contacted cells where fine linewidth photolithographic processing is required on this surface.

The type of benefit obtained by tilting even a few degrees is shown by comparing FIGS. 6 and 7. Without tilting as in FIG. 6, light reflected from the rear can be coupled straight out. For slats on the top surface, 100% would be coupled out in this way while, for randomly distributed pyramids, the corresponding figure is 56%. Despite this waste, the Stanford University point contact cell (R. A. Sinton, Y. Kwark, J. Y. Gan and R. M Swanson, *IEEE Electron Devices Letters*, Vol. EDL-7, p.567, 1988) which incorporates this scheme has demonstrated the highest level of light trapping in any experimental silicon cell to date.

By tilting even a few degrees (greater than 2°), this situation is greatly improved as shown in FIG. 7. Such tilting eliminates the escape route for approximately one half the rays as shown. The situation improves as the angle of tilt increases. By the time the tilt has reached 20°, virtually all the light is trapped after the first rear reflection.

For cells not intended for encapsulation, as for some concentrator cells, quite moderate values of tilt (e.g., 8°) would be most appropriate. (This is because the "double bounce" reflection mechanism of encapsulated textured cells, discussed hereinafter, is operative only for a restricted range of incident angles. As the tilt increases, this acceptance range is displaced from its symmetrical position around the perpendicular to the cell.) For the more general case where the cell is to be encapsulated, the analysis leading to FIG. 13 applies, showing that angular acceptance is not a problem in this case, even for high tilt angles. This allows the full benefits of light trapping and reflection control to be obtained.

FIG. 14 shows the percentage of light remaining trapped in a cell as a function of the number of passes across it, assuming unity rear reflection. Three cases are shown. The case shown dotted is the ideal "Lambertian" case where the direction of light is randomized in the cell's interior (P. Campbell and M. A. Green, *J.*

*Appl. Phys.*, Vol. 62 pp. 243-249, 1987). The lowermost curve corresponds to the case of upright pyramids randomly distributed on the top surface and a planar rear surface. The intermediate curve shows the same case but with the pyramids tilted 24°.

Other benefits from tilting arise from decreased reflection when cells are encapsulated under a lower refractive index layer such as glass, as is the case in normal applications.

It is seen in FIG. 4 that upright pyramids and slats help reduce reflection loss in cells. Additional mechanisms for further reducing reflection loss come into operation once the pyramids and slats are tilted.

FIG. 10 shows two such mechanisms for the case of slats. Once the tilt in the plane of the paper becomes greater than about 15°, all light incident on the more steeply sloping face (A in FIG. 10) has three chances of getting coupled into the cell. The corresponding reflection is reduced from R for a single reflection to $R^3$. If $R=0.2$, $R^3$ has the very low value of 0.008. Light incident on the section of the less steeply sloping near the intersection with the other face (B in FIG. 10) will have two chances of being coupled in as in the untilted case. Light incident on the remainder of the less steeply sloping face has a single reflection from the silicon. However, provided the tilt is less than about 33°, it will be totally internally reflected at the point where it strikes the glass/air interface. It will be reflected back on to the cell and strike the cell at least twice more before being coupled out. Hence the reflection from this region is less than $R^3$.

Therefore by tilting between about 15° to 33°, reflection can be reduced significantly below the value of $R^2$ in the case of slats. The case of tilted pyramids is even better due to an additional reflection control mechanism in this case. This is illustrated in FIG. 11. If the pyramids of FIG. 3 are tilted towards one of the corners of their base an angle of about 15°, the normal doubly reflected light of FIG. 4 is totally internally reflected when it strikes the glass/air interface. It must strike the cell at least once more before finally escaping, reducing the effective reflectance to $R^3$. Combining this with the other mechanisms previously mentioned, this means that reflection can be reduced below $R^3$ for a wide range of tilts. This is a negligible figure for most situations of interest, meaning that no other means of reflection control is required. These advantages can also be obtained for the case of slats by adding a component of the tilt in a direction perpendicular to the slat direction (out of the page in FIG. 6).

Often an anti-reflection coating is added to the cell surface at extra cost, to reduce reflection from the top surface. A potentially much lower cost alternative is to use tilted pyramids, which adds an additional "twist" component to the reflected light, increasing the internal angle it makes with the glass-air interface. For tilts greater than 14°, this internal angle is larger than the critical angle for total internal reflection. The light is consequently reflected downwards onto the cell surface and gets the benefit of another "double bounce" before another escape opportunity arises. A total of four bounces reduces the reflection to $R^4$ which has a value of only 0.16% when R equals 20%.

The actual situation is more complex than outlined above. One class of ray escapes after only three points of contact with the cell surface, although this effect is offset by other rays which have five points of contact. Computer ray tracing techniques were used to calculate the results of all such effects. A random distribution of pyramids was assumed, as expected from normal texturing techniques. The results are shown in FIG. 12.

Reflection of perpendicularly incident light has a value of 3.2% until the pyramid tilt reaches 14°. Reflection then drops abruptly to 0.15%. It stays below 0.2% until the tilt angle reaches 26°. It then starts increasing as triple and eventually even double bounces start becoming more important.

The angular sensitivity of this approach to reflection control was of considerable interest FIG. 13 shows the percentage reflection for upright pyramids (0° tilt) and pyramids of 24° tilt, near the middle of the low reflectance range of FIG. 12. The upright pyramids have their worst performance for perpendicular light, although reflection remains relatively high at about 2.5% for most angles of incidence. The pyramids with 24° tilt give extremely low reflection (0.2%) for light near perpendicular incidence. The reflection increases initially very slowly and then more quickly with angle of incidence. Beyond 60° away from the normal, the reflection from the top glass/air interface increases very rapidly swamping effects at the cell/encapsulant interface of present interest.

The energy received by a stationary photovoltaic module in the field is heavily weighted to angles of incidence around the perpendicular by the above air/glass reflection and by both the cosine law and atmospheric path length. The latter weighting is even more pronounced when the module tracks the sun.

The effect of tilting upon the limiting current output of the cell as a function of cell thickness is shown in FIG. 15. One result of interest is that, for a 100 micron thick cell, tilted pyramids increase the limits on current output by 2-2.5% compared to upright pyramids.

The tilting of the pyramids and slats is very simply obtained by specifying "off-axis" wafer orientation. For solar cell work, (100) orientated wafers are normally specified although, for more general microelectronics work, (111) orientated Wafers are readily available and (110) orientated wafers are available at a premium. For the case of pyramids, the desired tilting towards a corner of a pyramid can be obtained by specifying a wafer orientation the desired number of degrees off-axis from a (110) plane towards the (110) plane. This would correspond to a wafer surface parallel to a (mnO) plane, where m>n. Other surface orientations would, of course, be suitable for implementing the ideas described.

The techniques for forming the pyramids and slats in "off-axis" wafers would be identical to those used in normal wafers. Pyramids are usually formed by etching wafers in dilute NaOH solutions. KOH solutions are also suitable, and hydrazine has been used Wenham and Green (U.S. Pat. No. 4,625,613) have also described a laser based technique for nucleating pyramid growth when used in conjunction with selective etches as as described above. Photolithographic patterning of etch resistant layers on the wafer surface can also be used to control pyramid nucleation.

Slats can also be formed in the surface using the same selective etches as above. Laser or photolithographically defined patterns can be used to control the patterning as above.

Polycrystalline wafers are also widely used commercially to produce solar cells. It has been widely thought that surface texturing of such wafers to form pyramids would not be particularly beneficial, since few grains would be close to the (100) orientation required to produce low reflection. However, because of the effects described herein, it can be seen that a far wider range of grain orientation can be tolerated when the cells are encapsulated under glass. Implementation of the invention would be achieved by texturing wafers when texturing had not previously been thought to be necessary, by selecting growth conditions or wafering techniques to encourage grain orientation between (100) and (110) or otherwise "off-axis" from (100), or by arranging for the rear contact to remain flat, to encourage light trapping, while the top surface is textured.

One perceived problem with the growth of silicon substrates in the form of continuous ribbons has been that it has been difficult to grow ribbon of (100) orientation. It has been thought that this would prevent the advantages of surface texturing from being obtained. However, according to the present invention, texturing of such surfaces may also produce very low reflectance values when encapsulated under glass, even though surfaces are orientated well away from (100) orientation. Implementation of the invention would occur by texturing substrates where previously no advantage had been perceived from such texturing or by leaving the rear of the substrate untextured, to encourage light trapping, while texturing the top surface to form tilted pyramids or slats.

Although the invention has been described for the case of crystallographically defined pyramids and slats, it is obvious that the reflection control and light trapping methods described would also apply to other structures on the top surface of the cell. For example, it would apply when pyramids and slats were defined by other techniques than crystallographic such as plasma etching, laser machining, wet chemical etching and so on and for structures which only very crudely approximate pyramids and slats, such as wave-like patterns. A planar edge to the geometrical feature designed is not essential.

A further advantage of the approach is that improved light trapping in the bulk of the substrate may be obtained by a combination of the effects described. Tilted pyramids and slats and similar structures on the surface of encapsulated cells will not only reduce reflection and keep light trapped into the substrate for a large number of passes, light emerging from the substrate will emerge at a skewed angle which will cause most of it to be totally internally reflected at the top encapsulant/air interface which will cause a further boost in light trapping.

We claim:

1. A solar cell comprising:
    a substrate of semiconductor material having a light receiving surface which is textured with a geometric structure of grooves or pyramids, the geometric structure being tilted at an angle $\alpha$ from the (100) plane of the substrate wherein a component of the angle $\alpha$ is towards the (110) plane.

2. The solar cell of claim 1 wherein the angle of tilt $\alpha$ is in the range of 2°–33°.

3. The solar cell of claim 2 wherein the substrate is not encapsulated and the angle of tilt $\alpha$ is in the range of 7°–8°.

4. The solar cell of claim 2 wherein the substrate is encapsulated and the angle of tilt $\alpha$ is in the range of 15°–24°.

5. The solar cell according to claim 1 wherein the light receiving surface is textured with a pattern of randomly distributed pyramids.

6. The solar cell according to claim 1 wherein the light receiving surface is textured with a pattern of pyramids.

7. The solar cell according to claim 1 wherein the substrate is formed from a wafer of silicon cut at an angle $\alpha$ to the (100) plane in which a component of the angle $\alpha$ is toward the (110) plane.

8. A method of manufacturing a solar cell comprising the steps of:
    (a) sawing a crystalline wafer of semiconductor substrate material at an angle $\alpha$ to its (100) plane wherein a component of the angle $\alpha$ is towards its (110) plane; and
    (b) using selective etching to etch a top surface of the substrate thereby producing a geometric structure of ridges or pyramids in the top surface, the geometric structure being tilted relative to the bottom surface of the substrate by said angle $\alpha$ as a result of the selective etching.

9. The method according to claim 8 wherein the angle $\alpha$ is in the range of 2°–33°.

10. The method according to claim 9 wherein the substrate is not encapsulated and the angle $\alpha$ is in the range 7°–8°.

11. The solar cell of claim 9 wherein the substrate is encapsulated and the angle $\alpha$ is in the range of 15°–24°.

* * * * *